United States Patent [19]

Kameya

[11] Patent Number: 4,686,495

[45] Date of Patent: Aug. 11, 1987

[54] FINELY VARIABLE DELAY LINE INCORPORATING COARSELY AND FINELY VARIBLE DELAY LINE ELEMENTS

[75] Inventor: Kazuo Kameya, Tsurugashima, Japan

[73] Assignee: Elmec Corporation, Saitama-Ken, Japan

[21] Appl. No.: 830,837

[22] Filed: Feb. 19, 1986

Related U.S. Application Data

[63] Continuation of Ser. No. 872,110, Feb. 18, 1986, abandoned, and a continuation of Ser. No. 844,100, Feb. 18, 1986, abandoned.

[30] Foreign Application Priority Data

Feb. 18, 1985 [JP] Japan .................... 60-31338

[51] Int. Cl.$^4$ ................ H03H 7/34; H01P 9/00
[52] U.S. Cl. ................ 333/156; 333/139; 333/140; 333/161
[58] Field of Search ................ 333/138–140, 333/161–163, 156, 246

[56] References Cited

U.S. PATENT DOCUMENTS 3,114,121 12/1963 Jordan .................... 333/161

FOREIGN PATENT DOCUMENTS 2453851 5/1976 Fed. Rep. of Germany ...... 333/161

OTHER PUBLICATIONS

"Constant Delay Lines, Data Sheet No. 102", Control Electronics, Huntington Station, L.I., N.Y., Received in U.S. Patent Office, Mar. 25, 1959; 4 pages.
"Step Variable Delay Lines", Advance Electronics Co., Inc., Passaic, N.J., Received U.S. Patent Office, Mar. 1956; 1 sheet.
"Continuously Varible Time Delay", Advance Electronics Lab, Inc., Passaic, N.J. Received U.S. Patent Office, Mar. 1956; 1 sheet.

Primary Examiner—Marvin L. Nussbaum
Attorney, Agent, or Firm—Wegner & Bretschneider

[57] ABSTRACT

This finely variable delay line includes a first variable delay line element the delay time provided by which can be relatively coarsely varied, and a second variable delay line element the delay time provided by which can be relatively finely varied, connected in series with the first variable delay line. A reflection circuit is constituted between an element included in the second variable delay line and another element of the construction, the reflection circuit reflecting back a signal towards the element of the second variable delay line. Although some slight mismatching is in fact present, such mismatching is quite negligible in practice, and this variable delay line can be very finely adjusted by steps of as little as 0.5% of its total range or less.

9 Claims, 10 Drawing Figures

FINELY VARIABLE DELAY LINE INCORPORATING COARSELY AND FINELY VARIBLE DELAY LINE ELEMENTS

This application is a continuation of Ser. No. 872,110, filed Feb. 18, 1986 and now abandoned; and Ser. No. 844,100 filed Feb. 18, 1986 and now abandoned.

BACKGROUND OF THE INVENTION

The present invention relates to the field of variable delay lines. and more specifically relates to a variable delay line suitable for handling ultra high speed signals, whose delay time can be finely varied over a large number of relatively small steps.

There are currently available conventional type high precision and high speed delay lines, the delay time of which can be varied in the range of from 0 to about 2 ns (nanoseconds) over about 40 or so stages, i.e. by individual steps of about 50 ps (picoseconds), and whlch can handle ultra hlgh speed signals having rise time of 300 ps or less. Such high speed delay lines are typically available in DIP packages. In such typical conventional high precision and high speed delay lines, its delay time can typically be varied at a resolution of about 2.5% of the overall range of delay time, by utilizing a single adjustment mechanism.

However, recently there has made itself felt a growing demand for even finer adjustability of delay time. i.e. for smaller adjustment steps relative to the total delay time range. For instance, it has become desired to achieve a resolution of 1% or finer. However, according to prior art constructions, provision of such a fine adjustability resolution has necessitated the provision of a hundred or more fixed contacts to be switched over between. and this not only increases costs and causes difficulty in manufacture but also means that the device loses its desirable degree of compactness. Further, it becomes very difficult to adjust the delay time of the delay line by using only a slngle adjustment mechanism, when the fineness of the resolution of the delay line is thus increased.

SUMMARY OF THE INVENTION

The present inventive entity has studied the problems associated with variable delay lines outlined above, and has discovered that extremely fine resolution of adjustment of delay time is practicable by utilizing in the variable delay line, in series, two adjustment mechanisms, a coarse adjustment mechanism and a fine adjustment mechanism. Further, the present inventive entity has discovered that by utilizing some ingenuity in the connection of the various terminals of said series connected coarse adjustment mechanism and fine adjustment mechansm, although partial mismatching will inevitably sometimes occur, such mismatching can be reduced to a level which is negligible in practice.

Accordngly, it is the primary object of the present invention to provide a finely adjustable variable delay line, which avoids the above described problems.

It is a further object of the present invention to provide such a finely adjustable variable delay line, which can be adjusted in very fine steps of less than 1% of its total range, thus having fine resolution.

It is a further object of the present invention to provide such a finely adjustable variable delay line. which presents very little wave form distortion in its output signal.

It is a yet further object of the present invention to provide such a finely adjustable variable delay line, which is simple in structure.

It is a yet further object of the present invention to provlde such a finely adjustable variable delay line, which, although being capable of being finely adjusted, is still compact in structure.

It is a yet further object of the present invention to provlde such a finely adjustable variable delay line. which is easy to adjust.

It is a yet further object of the present invention to provde such a finely adjustable variable delay line, which is economical to manufacture.

According to the present invention, these and other objects are accomplished by a finely variable delay line, comprising: (a) a first variable delay line element the delay time provided by which can be relatively coarsely varied; and (b) a second variable delay line element the delay time provided by which can be relatively finely varied, connected in series with said first variable delay line; (c) said second delay line comprising an element, wherein a reflection circuit is constituted between said element of said second variable delay line and another element of the construction. said reflection circuit reflecting back a signal towards said element of said second variable delay line.

According to the present invention as defined above, fine adjustment can be made by utilizing the first variable delay line element for coarse adjustment of the delay time, and by utilizing the second variable delay line element for fine adjustment of the delay time. And, although there may be a slight mismatching of the signal in the movable contact portion, and multiple reflection of sald signal as will be explained hereinafter, in fact this mismatching can be controlled to a level which is negligible in practice.

BRIEF DESCRIPTION OF THE DRAWINGS

The present invention will now be shown and described with regard to certain preferred embodiments thereof, and with reference to the illustrative drawings, which however should not be considered as limitative of the present invention, since the scope thereof is to be considered as being delimited solely by the accompanying claims. In these drawings:

DESCRIPTION OF THE PREFERRED EMBODIMENTS

Figure 1:
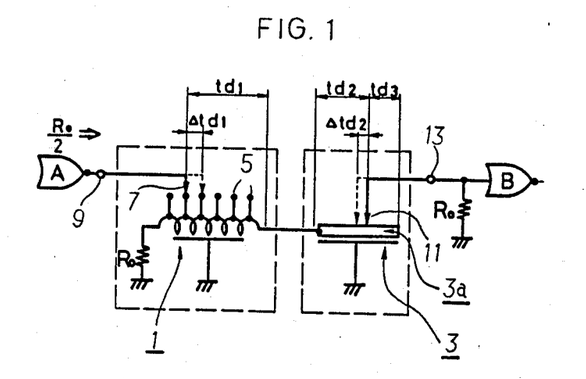
FIG. 1 is a schematic circuit diagram showing the identical electrical layouts of the first preferred embodiments of the finely variable delay line of the present invention.

The present invention will now be described with reference to the preferred embodiments thereof. FIG. 1 shows a electrical circuit diagram for the first preferred embodiment of the finely variable delay line of the present invention. In this figure, the reference numeral 1 denotes a first variable delay line element. while 3 denotes a second variable delay line element; each of these delay line elements has characteristic impedance Ro, and they are connected in series. The first variable delay line element 1 is provided with, at intermediate points thereof, a plurality of fixed contacts 5 at delay time steps of $\Delta td1$, and a movable contact member 7 is provided for switching over between said fixed contacts 5. The one end of the first variable delay line element 1 is connected to ground via a terminal resistor having resistance equal to Ro, while its other end is connected to an end of the second variable delay line element 3. And the movable contact member 7 is connected to a circuit of a preceding electronic stage, for instance to the output of a NOR gate A, via an input terminal 9 for the delay line as a whole.

Since the input impedance of the first variable delay line element 1 at its movable contact member 7 is Ro/2, the impedance of the circuit between the movable contact member 7 and the NOR gate A is selected to be Ro/2, so that the NOR gate A may drive a circuit of impedance Ro/2, i.e. may be presented with such an output impedance.

The second variable delay line element 3 is provided with, at intermediate points thereof, a plurality of fixed contacts (not particularly shown in FIG. 1, but shown in FIG. 4) at delay time steps of $\Delta td2$ which is set to be a substantially smaller value than $\Delta td1$; and a movable contact member 11 is provided for switching over between said fixed contacts. The one end of the second variable delay line element 3 is connected to said end of the first variable delay line element 1, while the other end of said second variable delay line element 3 is not connected to anything; in other words, it is left open. And the movable contact member 11 is connected to a terminal resistor Ro and to a circuit of a following electronic stage, for instance to the input of a NOR gate B, via an output terminal 13 for the delay line as a whole. The impedance of the circuit between the movable contact member 11 and the NOR gate B is selected to be Ro.

Thus, an input signal is supplied from the output of the NOR gate A of the preceding electronic stage to the movable contact member 7 of the first variable delay line element 1, and the output signal from the movable contact member 11 of the second variable delay line element 3 is supplied to the input of the NOR gate B of the following electronic stage.

Now, particular possible concrete constructions for the first variable delay line element 1 and the second variable delay line element 3 of this first preferred embodiment will be described in the following.

Figure 2:
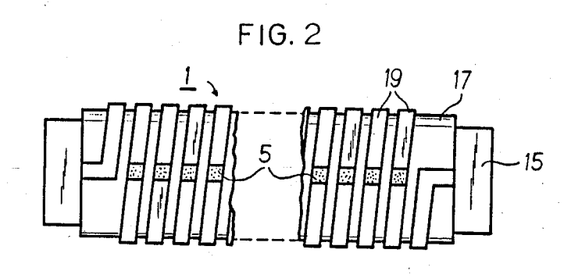
FIG. 2 is a front view of a particular possible construction for a first variable delay line element of said first preferred embodiment.
Figure 3:
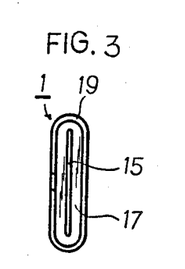
FIG. 3 is a side view of said first variable delay line element.

The first variable delay line element 1 is constructed as a distributed constant type, as shown in front and side views in FIGS. 2 and 3 respectively, by forming a dielectric layer 17 around the outer circumference of an elongated substantially planar ground electrode member 15, and by winding an electroconductive strip around the surface of said dielectric layer 17 as a single layered solenoid in a spaced manner. For each such turn of the solenoid, a portion of the electroconductive strip 19 serves as one of the fixed contacts 5 of the first variable delay line element 1, and the movable contact member 7 (not particularly shown in FIGS. 2 and 3), which is made of a contact spring disposed so as to be slidable, selects one or another of said fixed contacts 5 and makes electrical contact therewith.

Figure 4:
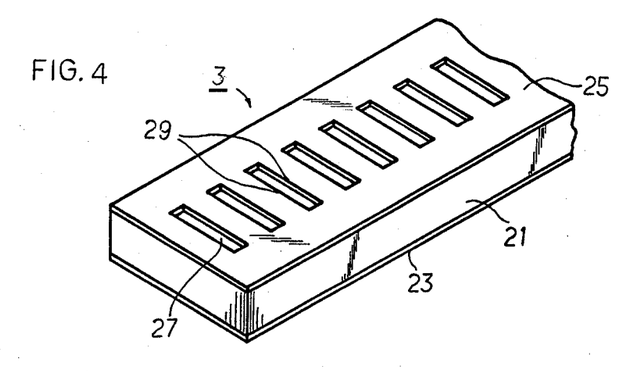
FIG. 4 is a partial perspective view of a particular possible construction for a second variable delay line element of said first preferred embodiment.

The second variable delay line element 3 is constructed by, as shown in perspective view in FIG. 4, forming a ground electrode layer 23 over one whole surface (the lower surface in the figure) of a dielectric plate 21, and by layering an electroconductive strip 25 on the other side (the upper side in the figure) of said dielectric plate 21 opposing said ground electrode layer 23 with the interposition of the dielectric material of said dielectric plate 21. A plurality of rectangular depressions 27 surrounded by edge portions 29 are formed at a certain pitch along the longitudinal direction of the electroconductive strip 25, said rectangular depressions 27 extending in the transverse direction of said electroconductive strip 25. And the movable contact member 7 (not particularly shown in FIG. 4), which is made of a contact spring disposed so as to be slidable, pops into one or another of said rectangular depressions 27, thereby selecting one or another of said edge portions 29 which function as fixed contacts and makes electrical contact therewith.

Figure 5:
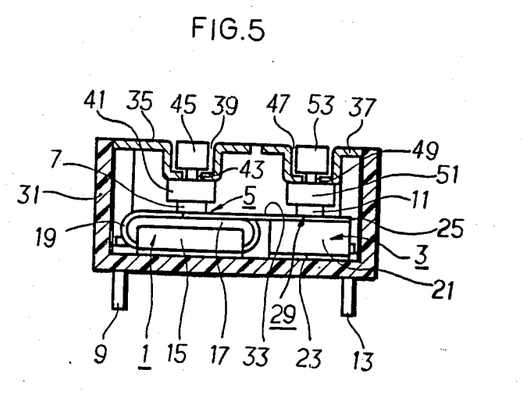
FIG. 5 is a side view, partially broken away, showing the physical layout and construction of said first preferred embodiment delay line as a whole.

In FIG. 5, there is shown a side view, partially broken away, showing the physical layout and construction of this first preferred embodiment of the finely variable delay line of the present invention, which is made by conjoining the first variable delay line element 1 and the second variable delay line element 3 according to the circuit diagram of FIG. 1; however, as will be understood from what follows later, other possible physical arrangements employing said first and second delay line elements 1 and 3 of FIGS. 2 through 4 could be conceived of.

Specifically, referring to FIG. 5, the first variable delay line element 1 of FIGS. 2 and 3 and the second variable delay line element 3 of FIG. 4 are connected in series as described above and are placed side by side lying generally parallel to one another on the bottom surface of a box shaped case 31 which may be made of synthetic resin or other suitable material. The reference numeral 33 denotes the connection point between the first variable delay line element 1 and the second variable delay line element 3.

The input and the output terminals 9 and 13 and ground terminals not shown in the drawing are provided by being passed through the bottom of the case 31 and securely fixed thereto, and the upper open face of the case 31 is closed by a pair of electroconductive plates 35 and 37, which are arranged parallel to one another but slightly spaced apart from one another so as to be electrically isolated from one another. The one 35 of these electroconductive plates is located above and parallel to the first variable delay line element 1, and is connected to the input terminal 9. And this electroconductive plate 35 is bent into a channel or trough shape 39 which protrudes towards and along the first variable delay line element 1 and which has a slit 43 formed along its bottom parallel to said first variable delay line element 1. A frame type holder 41 is disposed between the lower surface of said trough shape 39 and the first variable delay line element 1, and is slidingly actuated to move along said first variable delay line element 1 by a knob 45 connected through said slit 43 to said holder 41. The previously mentioned first spring type movable contact member 7 is mounted to the side of said holder 41 towards the first variable delay line element 1, and is held so as to be in springing electrical contact both with the electroconductive plate 35 and with one or another of the fixed contact portions 5 of said first variable delay line element 1, according to the position to which said movable contact member 7 is set by the hand of the user moving the knob 45. Thus, by moving said knob 45, said input terminal 9 can be set to be connected to one or another of the fixed contact portions 5, via the movable contact member 7, as desired.

The other one 37 of the electroconductive plates 35 and 37 is located above and parallel to the second variable delay line element 3, and is connected to the output terminal 13. And this electroconductive plate 37 is bent into a channel or trough shape 47 which protrudes towards and along the second variable delay line element 3 and which has a slit 49 formed along its bottom parallel to said second variable delay line element 3. A frame type holder 51 is disposed between the lower surface of said trough shape 47 and the second variable delay line element 3, and is slidingly actuated to move along said second variable delay line element 3 by a knob 53 connected through said slit 49 to said holder 51. The previously mentioned second spring type movable contact member 11 is mounted to the side of said holder 51 towards the second variable delay line element 3, and is held so as to be in springing electrical contact both with the electroconductive plate 37 and with one or another of the fixed contact portions 29 of said second variable delay line element 3, according to the position to which said movable contact member 11 is set by the hand of the user moving the knob 53. Thus, by moving said knob 53, the output terminal 13 can be set to be connected to one or another of the fixed contact portions 29, via said movable contact member 11, as desired.

Now, some discussion as to the operation of this variable delay line constituted as explained above will be presented.

Referring to FIG. 1, as a signal from the output of the NOR gate A is supplied to the movable contact member 7 of the first variable delay line element 1, this signal is branched in its transmission path in said first variable delay line element 1, and the portion of said signal traveling to the left in FIG. 1 is absorbed by the terminal resistor Ro, while the portion of said signal traveling to the right in said figure is transmitted to the second variable delay line element 3 with the time delay of td1 by passing through the first variable delay line element 1, without any substantial reflection taking place since the characteristic impedances of the first variable delay line element 1 and the second variable delay line element 3 are substantially equal to one another. And, in the second variable delay line element 3, the signal reaches the movable contact member 11 thereof after the time delay of td2.

Since this movable contact member 11 is connected to the external resistor of resistance Ro by way of the output terminal 13, and a delay line portion 3a is present between said movable contact member 11 and the open end of the second variable delay line element 3, the apparent impedance as seen from the upstream of the signal towards the movable contact member 11 is Ro/2, and some mismatching arises.

Therefore, according to the conventional concept and conventional electronic wisdom, since the output signal obtained from the output terminal 13 would be corrupted by attenuation of amplitude, distortion of wave form, and degradation in rise time, the connection structure as outlined above for the second variable delay line element 3 would not be considered to be practicable.

However, careful study of the above explained structure by the present inventive entity has revealed the following facts.

Since the inputted signal is split into two at the movable contact member 11 of the second variable delay line element 3, and the signal transmitted into the portion 3a of said second variable delay line element 3 is reflected by the open end thereof and returns back to the movable contact member 11 again, this portion of the second variable delay line element 3 constitutes a reflection circuit. Therefore, if the delay time of the portion 3a of the second variable delay line element 3 on the right side in FIG. 1 is taken as td3, the delay time td required for the signal to reciprocated will be equal to 2td3. It has been found that, if this reciprocating time td is smaller than the rise time tr of the signal passing through the first variable delay line element 1 and the second variable delay line element 3, and if in fact td is less than approximately 0.75 tr, then the delay time of the signal passing through the second variable delay line element 3 is only increased slightly ($\Delta$td), and the various forms of signal corruption such as attenuation of amplitude, distortion of wave form, and degradation of rise time are practically negligible.

As an example, an output signal obtained from the output terminal 13 of an exemplary case of the variable delay line of FIG. 1, with td equal to approximately 0.2 tr in this example, will be discussed in the following with reference to FIG. 9. which is a time chart of said output signal.

Figure 9:
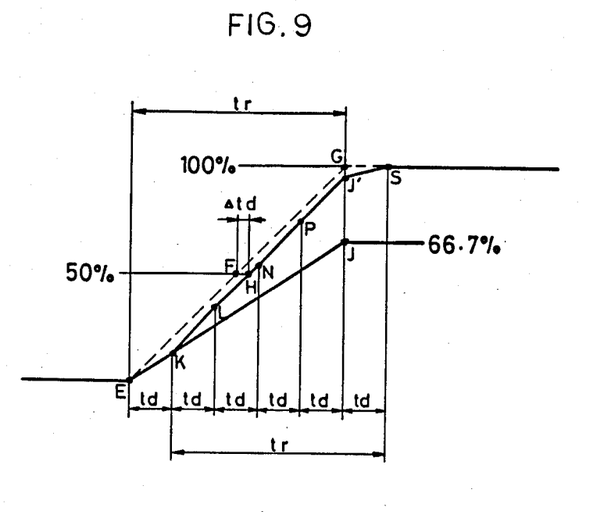
FIG. 9 is an exemplary time chart showing the output signal obtained from an output terminal of an exemplary case of the first preferred embodiment variable delay line of FIGS. 2 through 5.

If it were to be assumed that the portion 3a of the second variable delay line element 3 to the right in FIG. 1 of the movable contact member 11 thereof did not exist, then there would be good matching at the portion thereof proximate to said movable contact member 11, and the output signal would rise from the point E of 0% amplitude to the point G of 100% amplitude in time tr as exemplarily shown by the brosen line ln FIG. 9.

However, since actually said portion 3a of the second variable delay line element 3 to the right in FIG. 1 of the movable contact member 11 thereof does exist, the signal passing thereinto is reflected by the open end thereof and returns to the portion thereof proximate to the movable contact member 11 after the delay tlme of td. The reflection factor of the movable contact member 11 as seen from said delay line portion 3a is $-\frac{1}{3}$, and the signal reflected from the open end of the second variable delay line element 3 is again reflected at the point (portion) of the movable contact member 11. Thereafter, the reflections are further repeated indefinitely.

In this case, the wave form obtained at the output terminal 13 rises from amplitude 0% to amplitude 100% through the points E, K, L, N, P. J', and S. In other words, the signal initially rises from the point E towards the point J which is of an amplitude about 66.7%, but, by addition of the reflection at the point K after the delay time td, thereafter rises sharply towards the point L; and the reflected signal is again added at the point L, after another time delay td from the point K. Thereafter, by repetition of the decrease and the increase of the slope of the rising signal level, at each time delay td, said slope of the rising signal level becomes substantially equal to the slope of the broken line. The wave reflected at the movable contact member 11 along the portion 3a of the second variable delay line element 3 alternates between positive and negative polarities at every time interval td. The slope after the point K is substantially equal to that of the broken line, and thus it is seen that, in this case that td is less than approximately 0.75 tr being in fact equal to approximately 0.2 tr, the delay time of the signal passing through the second variable delay line element 3 is only increased slightly ($\Delta$td), and the various forms of signal corruption such as attenuation of amplitude, distortion of wave form, and degradation of rise time are practically negligible.

On the other hand, if it should be the case that td should be greater than approximately 0.75 tr, since the amplitude at the point K would exceed the point of 50% amplitude, then the solid line would very substantially diverge from the broken line, and the corruption of the wave form might not be negligible. Considering a typical use for such a high speed variable type delay line, since an ECL (emitter coupled logic device), which is a super high speed IC (integrated circuit), which is often connected to a variable delay line, has a threshold level typically at about 50% amplitude of the input signal, the slope of the signal at least in the vicinity of the threshold level is desired to be linear as indicated by the broken line in FIG. 9. Therefore, it is necessary to reduce the point K below the point of amplitude 50%, and, according to this condition, td is desired to be less than 0.75 tr. However, this relationship between td and tr is not absolute, but can be varied by changing the set pont of the threshold level of the ECL and so on, or by changing the application to which this super high speed variable type delay line is put; and the relationship that td is less than 0.75 tr is by no means absolutely necessary.

Furthermore, since td and tr will naturally fall into the range of values mentioned above when the variable delay line of the present invention is applied to a super high speed signal of rise time 1 ns or faster, there is in this case no need for special consideration to be given to maintaining the above mentioned relationship. For instance, considering a particular numerical example, when the delay time in the range of 0 to 2 ns is to be varied by steps of 0.5%, which is a typical desired performance for an actual variable delay line, then the first variable delay line element 1 can typically be arranged to cover the range 0 to 1.9 ns in nineteen steps of 100 ps each, with $\Delta$td1 set to be equal to 5%, while the second variable delay line element 3 can typically be arranged to cover the range 0 to 100 ps in ten steps of 100 ps each, with s $\Delta$td2 set to be equal to 0.5%. As will be explained hereinafter, the second variable delay line element 3 is arranged to have delay time of 200 ps, by forming the fixed contact portions 29 at the edges of the depressions 27, as shown in FIG. 4, at intervals corresponding to each 20 ps. Since the fastest practically available ECL devices have rise times of the order of 1 ns, if the delay time of the second variable delay line element 3 is 200 ps, then the time interval td required for the signal to reciprocate therein is equal to 400 ps, and the relationship certainly holds that td is less than 0.75 tr, since in fact td is equal to 0.4 tr.

Now, the delay time provided by the above described first preferred embodiment of the finely variable delay line of the present invention will be discussed, with reference to the above exemplary numerical specifications therefor. With reference to FIG. 9, it is apparent therefrom that there is an increase of delay time of $\Delta$td roughly equal to 0.25 td between the solid line and the broken line at the point of amplitude about 50%, in other words between the point F and the point H. If the movable contact member 11 of the second variable delay line element 3 is moved to its rightmost position, then the delay time td2 of the output signal due to the second variable delay line element 3 will be 200 ps.

Now, when said movable contact member 11 is moved to the left by one step, then the delay time provided by the second variable delay line element 3 will be decreased by one step, i.e. by 20 ps, and now becomes 180 ps. However, since the portion 3a of said second variable delay line element 3 to the right in FIG. 1 of said movable contact member 11 exists, and since the reflected wave which has reciprocated over the time interval td equal to 40 ps is supplied again to said movable contact member 11, there will be an increase in the delay time by $\Delta$td equal to 10 ps at the portion of the second variable delay line element 3 corresponding to said movable contact member 11. Therefore, even though said movable contact member 11 is moved over a distance corresponding to 20 ps, the delay time presented by the second variable delay line element 3 only changes by 10 ps in reality.

Further, when said movable contact member 11 of said second variable delay line element 3 is moved to its leftmost position, then, even though in the simplistic analysis the delay time td2 of the output signal due to the second variable delay line element 3 would be zero, in fact the td of the reflected wave is 400 ps, and this causes an increase in the delay time $\Delta$td of $0.25 \times 400$ ps, i.e. of 100 ps. Therefore, the delay time td2 of the output signal due to the second variable delay line element 3 is equal to 100 ps, and is not zero in reality. In other words, it is possible to vary the delay time over the range of 100 ps to 200 ps by altering the setting of the movable contact member 11 of the second variable delay line element 3.

Therefore, by selecting the maximum delay time presented in the simplistic analysis by the second variable delay line element 3 to be twice the desired actual range of adjustment, it is possible to accurately cover said desired range. In other words, the actual steps of delay time variation obtained by sliding the movable contact member 11 are one half of the simplistically calculated delay time steps between neighboring ones of the fixed contact portions 29, and switching in fine steps of the total delay time presented by the combination delay line as a whole (including both the first variable delay line element 1 and also the second variable delay line element 3) is thus made available.

Thus, the second variable delay line element 3 incorporated in the finely variable delay line of the present invention displays a delay time variation property which is not present in conventional or common variable delay lines, due to the way in which it is connected, and, even though the finely variable delay line of the present invention does display some mismatching, nevertheless its delay property is typically quite acceptable from a practical point of view.

If a conventional type of variable delay line were required to have delay time steps of 0.5% of its total range, then two hundred and one fixed contact portions would be required in its construction, which would be rather impracticable and in any event would be expensive and difficult of fabrication; but, according to the finely variable delay line of the present invention, in the shown exemplary case, only twenty fixed contact portions were required for the first variable delay line element 1 for coarse adjustment, and only eleven fixed contact portions were required for the second variable delay line element 3 for fine adjustment, making thirty one in all. Thus, according to the present invention, it has been possible to realize a finely variable delay line using an order of magnitude less fixed contact portions than were necessary in the prior art. Accordingly, within typical production constraints which set a limit to the number of fixed contact portions which it is desirable or practicable to incorporate into the construction of a variable delay line, a substantial improvement in the resolution power of a variable delay line becomes possible.

Figure 6:
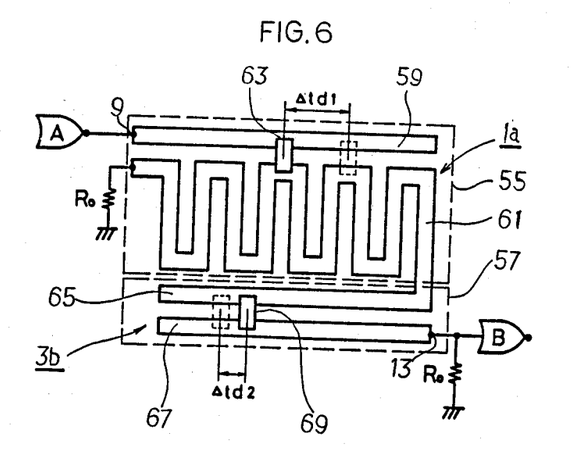
FIG. 6 is a plan view showng the physical layout. along with the circuit diagram and construction, of a second preferred embodiment of the finely variable delay line of the present invention.

FIG. 6 is a plan view showing the physical layout and the circuit and the construction of a second preferred embodiment of the finely variable delay line of the present invention. In this second preferred embodiment, rather than housing the first variable delay line element 1 and the second variable delay line element 3 in the single housing or case 31 of the first preferred embodiment to constitute a single assembled electronic component part as shown in FIG. 5, the finely variable delay line of the present invention is realized by arranging electroconductive strips such as microstrip lines over the surface of a circuit board.

Specifically, the first variable delay line element 1a is made up by laying a linear electroconductive strip 59 generally parallel to a sinuous or woggly electroconductive strip 61 which is convoluted in a generally rectangular manner as shown in the drawing, and these two electroconductive strips 59 and 61 are both laid down on the one surface of a circuit board 55 whose other surface is covered with a ground electrode, not shown in the drawing; and a first connection piece 63 is provided and is mounted so as to be movable along the linear electroconductive strip 59 in electrical contact therewith while physically and electrically contacting one or another of the sinuousities of the woggly electroconductive strip 61. The terminal resistor Ro to ground and the output of the NOR gate A (exemplarily) are connected as shown in FIG. 6 to the left end in the figure of the linear electroconductive strip 59 (which is in fact the input terminal 9) and to the left end of the woggly electroconductive strip 61, respectively. And the second variable delay line element 3b is made up by laying a linear electroconductive strip 65 generally parallel to another linear electroconductive strip 67 as shown in the drawing, and these two electroconductive strips 65 and 67 are both laid down on the one surface of another circuit board 57, illustrated as provided contiguous to the circuit board 55, whose other surface is also covered with a ground electrode, not shown in the drawing; and a second connection piece 69 is provided and is mounted so as to be movable along the linear electroconductive strips 65 and 67 in electrical contact therewith. The right end in the figure of the woggly electroconductive strip 61 and the input of the NOR gate B as connected to the other terminal resistor Ro to ground (exemplarily) are respectively connected as shown in FIG. 6 to the right end n the figure of the linear electroconductive strip 65 and to the right end (which in fact is the output terminal 13) of the linear electroconductve strip 67, while the left ends in the figure of said linear electroconductive strips 65 and 67 are left open and not connected to anything. Thus, in this structure, it is considered that the fixed contact portions are provided along the second variable delay line element 3b in a continuum thereof. In this second preferred embodiment of the finely variable delay line of the present invention, denoting the delay time difference or step between each sinuousity and the next of the woggly electroconductive strip 61 as $\Delta td1$, the overall delay time provided by the delay line as a whole may be coarsely varied by this step of $\Delta td1$ by moving the first connection piece 63 along the longitudinal direction of the two electroconductive strips 59 and 61 by a distance corresponding to one pitch of said woggly electroconductive strip 61, while said overall delay time may be varied by a fine step of $\Delta td2$ by appropriately moving the second connection piece 69 along the longitudinal direction of the two electroconductive strips 65 and 67.

According to this structure for the finely variable delay line, characteristcs which are acceptable in practice are obtained for the range in which td is smaller than tr. In other words, the impedance as seen from the upstream of the signal via the electroconductive strip 65 towards the second connection piece 69 is apparently Ro/3, and although some mismatching in fact exists it is not significantly troublesome in practice.

An important feature of the finely variable delay line of this structure is that the reflection factor of the second variable delay line element 3b as seen from the open ends of the electroconductive strips 65 and 67 towards the second connection piece 69 is zero. Therefore, referring to FIG. 10 which is a wave form diagram for an exemplary case of this second preferred embodiment similar to FIG. 9 for the first preferred embodiment, the output wave form at the output end of the second variable delay line element 3b initially rises from the point E of 0% amplitude towards the point J of 50% amplitude as shown in the figure, but from the point K reached after the time interval td starts to rise more sharply towards the point J'. In this case, since the signal reflected by the open end of the second variable delay line element 3b is all transmitted to the output end without being reflected by the second connection piece 69, the output wave form between the points K and J' is parallel to the wave form when there is no delay line portion to the left in the figure of said second connection piece 69, i.e. to the broken line E-G, and the increased delay time $\Delta td$ of the second variable delay line element 3b will become equal to 0.5 td. In this case, the condition for the point K not to surpass the point of 50% amplitude is that td should be less than tr. Thus, according to the present invention, the relationship between the reciprocating time td and the rise time tr depends upon the structure of the variable delay line.

With this second preferred embodiment of the present invention, it is necessary for the second variable delay line element 3b to be capable, according to its nominal specification and construction, of covering a range of adjustment of delay time twice as great as that which is actually required, according to the same logic as held for the first preferred embodiment of FIGS. 2 through 5; but this second preferred embodiment can produce better linearity of the rising portion of the waveform than can the first preferred embodiment. According to this FIG. 6 construction for the variable delay line, actually there is no particular difference in the properties thereof even if the left ends in the figure of the two electroconductive strips 65 and 67 are connected together.

Figure 7:
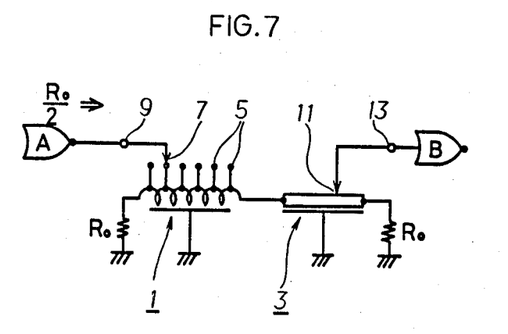
FIG. 7 is a schematic circuit diagram, similar to FIG. 1 for the first preferred embodiments, showing the electrical layout of the third preferred embodiment of the finely variable delay line of the present invention.

In FIG. 7, there is shown a schematic circuit diagram for a third preferred embodiment of the finely variable delay line of the present invention, in a fashion similar to FIG. 1 for the first preferred embodiments; reference symbols in this figure like to reference symbols in FIG. 1 refer to elements of this third preferred embodiment like to corresponding elements of the first preferred embodiments.

Figure 10:
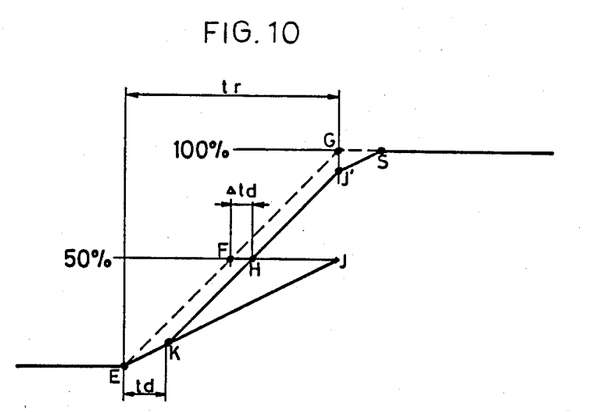
FIG. 10 is an exemplary time chart, similar to FIG. 9 relating to the first preferred embodiment, showing the output signal obtained from an output terminal of an exemplary case of the second preferred embodiment variable delay line of FIG. 6.

In this finely variable delay line, the right hand end of the second variable delay line element 3, which was left open or free in the first preferred embodiments, is instead connected to ground via a resistor of resstance Ro. On the other hand, beyond the movable contact element 11, the output terminal 13 is left open. Apart from these matters, there is no substantial difference between the electrical circuit of this third preferred embodiment and that of the frst preferred embodiments shown in FIG. 1. According to such a finely variable delay line, as before adjustment of the first variable delay line element 1 is utilized for coarse variation of delay time, while adjustment of the second variable delay line element 3 is utilized for fine variation of delay time. The part of the signal which is divided off at the movable contact element 11 and is transmitted to the output terminal 13 and to the NOR gate B is reflected back to said movable contact element 11, and the delay time at said movable contact element 11 increases. In other words, a reflection circuit is constituted from the movable contact element 11 to the side of the output terminal 13. In this case, since there is no difference in the delay time even when the movable contact element 11 is moved and the delay time of the second variable delay line element 3 is altered, it is only required for said delay time of said second variable delay line element 3 to be the same as the required range of fine variation of delay time. And, when the impedance from the movable contact element 11 to the input of the NOR gate B is Ro, a wave form such as that shown in FIG. 9 is obtained; while, when said impedance is Ro/2, a wave form such as that shown in FIG. 10 is obtained. The structure whose circuit pattern is shown in FIG. 10 is suitable for the finely variable delay line of the present invention, when it is anticipated that the line length between the output terminal 13 thereof and the input of the device to which it will be connected, i.e. the NOR gate B, will likely be short.

Thus, according to the present invention, fine adjustment of the overall properties of the delay line is possible, with adjustment of the first variable delay line element 1 being utilized for providing coarse adjustment and adjustment of the second variable delay line element 3 being utilized for providing fine adjustment, and the delay time steps provided by said adjustment of the second variable delay line element 3 can be varied by modifying the connections of said second variable delay line element 3, which thus allows of great freedom in such selection according to the specific application.

Figure 8:
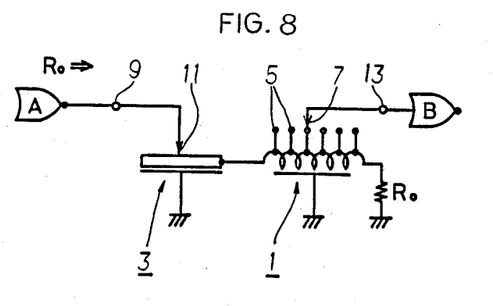
FIG. 8 is a schematic circuit diagram, similar to FIGS. 1 and 7 for the first and the third preferred embodiments, showing the electrical layout of the fourth preferred embodiment of the present invention.

In FIG. 8, there is shown a schematic circuit diagram for a fourth preferred embodiment of the finely variable delay line of the present invention, in a fashion similar to FIGS. 1 and 7. In this finely variable delay line, the first variable delay line element 1 and the second variable delay line element 3 are connected in the reverse order. In other words, the right hand end of the second variable delay line element 3 is connected to the left end of the first variable delay line element 1, the right hand end of which is connected to ground via a resistor of resistance Ro. On the other hand, beyond the movable contact element 7 of the first variable delay line element 1 to which it is connected, the side of the output terminal 13 is left open. Also, the left end of the second variable delay line element 3 beyond its movable contact member 11 is left free and is not connected to anything. Apart from these matters, there is no substantial difference between the electrical circuit of this fourth preferred embodiment and that of the first preferred embodiments shown in FIG. 1. According to such a finely variable delay line, as before adjustment of the first variable delay line element 1 is utilized for coarse variation of delay time, while adjustment of the second variable delay line element 3 is utilized for fine variation of delay time. Since the delay time variation provided by the first variable delay line element 1 is relatively large, it is not desirable to utilize it with its other right end left open as shown in FIG. 1, but, when it is anticipated that the line length between the output terminal 13 of the variable delay line and the input of the device to which it will be connected, i.e. the NOR gate B, will likely be short, it is possible to leave the output terminal 13 side open without providing any resistor thereto, as in the third preferred embodiment the circuit pattern of which is shown in FIG. 7. By leaving the other end of the second variable delay line element 3 open as shown in FIG. 8, a reflection circuit is constituted from the movable contact element 11 to the other end, and the delay time at the movable contact element 11 increases in the same manner as in the first preferred embodiment. Further, since it is possible to equalize the characteristic impedance between the output of the NOR gate A and the movable contact element 11 through the input terminal 9 with the impedance Ro of the variable delay line by virtue of the existence of some mismatching at the movable contact element 11, it becomes easy for the NOR gate A to easily drive this finely variable delay line.

Again, also in the second preferred embodiment shown in FIG. 6 it is possible for the output of the NOR gate A of the preceding stage to be connected to the electroconductive strip 67 of the second variable delay line element 3b and for the output of the NOR gate B of the following stage and the terminal resistor Ro to be connected to the electroconductive strip 59 of the first variable delay line element 1a. In this case, the reference numeral 13 will correspond to the input end and the reference numeral 9 will correspond to the output end.

Although the present invention has been shown and described in terms of certain preferred embodiments thereof, and with reference to the appended drawings, it should not be considered as being particularly limited thereby, but solely by the scope of the following claims.

What is claimed is:

1. A finely variable delay line, for providing a delay time in transmission of an input signal, comprising:

(a) first variable delay line means for providing a first delay time in transmission of said input signal, said first delay time being variable in first predetermined increments;

(b) second variable delay lines means, connected in series with said first variable delay line means, for providing a second delay time in transmission of said input signal, said second delay time being variable in second predetermined increments which are substantially smaller than said first predetermined increments;

(c) said second delay means comprising first and second elements, the first element of which splits said input signal into an output signal and a reflection signal, said reflection signal being repeatedly transmitted from said first element to said second element and back again, wherein each time said reflection signal is transmitted back to said first element, a portion of said reflection signal is added to said output signal, thereby increasing said second delay time.

2. A finely variable delay line as claimed in claim 1, wherein said first element is a movable contact which varies the second delay time and said second element is an open circuit, wherein said reflection signal is repeatedly transmitted from said movable contact to said open circuit and back again.

3. A finely variable delay line as claimed in claim 1, wherein said first element is a movable contact which varies the second delay time and said second element is an output terminal to which an external component is connected, wherein said reflection signal is repeatedly transmitted from said movable contact to said output terminal and back again.

4. A finely variable delay line for providing a delay time in transmission of an input signal, comprising:

(a) first variable delay line means for providing a first delay time in transmission of said input signal, comprising a first contact assembly and a first movable contact, said first contact assembly comprising a first elongated electroconductive strip having a first and a second end, a ground plate disposed in an opposing relationship to said electroconductive strip, and a dielectric body disposed therebetween, said electroconductive strip having a plurality of fixed contact at predetermined intervals therealong, said movable control being movable along said electroconductive strip to selectively contact one of said fixed contacts, thereby selectively varying said first delay time selectively in first predetermined increments;

(b) second variable delay means connected in series with said first variable delay means for providing a second delay time in transmission of said input signal, comprising a second contact assembly comprising a second elongated electroconductive strip having a first and a second end, a ground plate disposed in an opposing relationship to said electroconductive strip, and a dielectric body disposed therebetween, said electroconductive strip having a plurality of fixed contacts at predetermined intervals therealong, said movable contact being movable along said electroconductive strip to selectively contact one of said fixed contacts, thereby selectively varying said second delay time in second predetermined increments;

(c) wherein said second variable delay means further comprises an element, and said second movable contact splits the input signal into an output signal and a reflection signal, said reflection signal being repeatedly transmitted from said second movable contact to said element and back again, wherein each time said reflection signal is transmitted back to said second movable contact, a portion of said reflection signal is added to said output signal, thereby increasing said second delay time.

5. A finely variable delay line as claimed in claim 4, wherein the first end of said first electroconductive strip is connected to the first end of said second electroconductive strip, thereby connecting said first variable delay line means and said second variable delay line means in series.

6. A finely variable delay line as claimed in claim 5, wherein a terminal resistor is attached to the second end of said first electroconductive strip.

7. A finely variable delay line as claimed in claim 5, wherein said element is an open circuit located at the second end of said second electroconductive strip, said reflection signal being repeatedly transmitted from said second movable contact to said second end and back again.

8. A finely variable delay line as claimed in claim 5, wherein said element is an output terminal to which an external component is connected, said reflection signal being repeatedly transmitted from said second movable contact to said output terminal and back again.

9. A finely variable delay line as claimed in claim 8, wherein a terminal resistor is attached to the second end of said electroconductive strip.

* * * * *